US007110165B2

(12) United States Patent
Martin et al.

(10) Patent No.: US 7,110,165 B2
(45) Date of Patent: Sep. 19, 2006

(54) POWER MANAGEMENT FOR SPATIAL POWER COMBINERS

(75) Inventors: Suzanne C. Martin, Altadena, CA (US); Christopher J. Rollison, San Juan Capistrano, CA (US); Blythe C. Deckman, Corona, CA (US); James J. Rosenberg, Monrovia, CA (US)

(73) Assignee: Wavestream Wireless Technologies, San Dimas, CA (US)

( * ) Notice: Subject to any disclaimer, the term of this patent is extended or adjusted under 35 U.S.C. 154(b) by 355 days.

(21) Appl. No.: 10/283,850

(22) Filed: Oct. 29, 2002

(65) Prior Publication Data

US 2004/0080810 A1    Apr. 29, 2004

(51) Int. Cl.
*H01S 3/00*    (2006.01)
*H03F 3/60*    (2006.01)

(52) U.S. Cl. ........................ 359/333; 330/286
(58) Field of Classification Search ................ 359/333; 330/286; 342/175
See application file for complete search history.

(56) References Cited

U.S. PATENT DOCUMENTS 5,317,173 A * 5/1994 Sovero ........................ 257/197
5,392,152 A * 2/1995 Higgins et al. ............. 359/333
6,583,672 B1 * 6/2003 Deckman et al. ........... 330/286
2004/0080370 A1    4/2004 Martin et al.

FOREIGN PATENT DOCUMENTS

EP          000509214 A2 * 10/1992
WO        WO 02/099960 A1 * 12/2002

\* cited by examiner

*Primary Examiner*—Mark Hellner
(74) *Attorney, Agent, or Firm*—Sidley Austin LLP

(57) ABSTRACT

The present invention discloses a system for improving power management for spatial power combining systems, such as a quasi optical grid array amplifier. One aspect of the invention includes the provision of a patterned conductor on the surface the semiconductor chip that opposes the surface upon which the active devices are disposed. This metal material can be used to both enhance heat removal from the chip and to provide a new and more efficient DC biasing path (with the use of vias) for the active components on the other (front) surface of the chip. Another aspect of the invention is the introduction of a dielectric superstrate that attaches to the front surface of the chip to provide an alternative or complementary heat removal and/or biasing structure to the conventional substrate that is typically attached to the back side of the chip. Various combinations of the above features are disclosed.

22 Claims, 4 Drawing Sheets

100 ment the heat conducts away from the grid array will determine the chip's maximum operating power. Unfortunately, dielectric materials having the thermal conductivity necessary to carry away the heat generated are limited to diamond and a few others. Further, bonding of the dielectric spreader to the chip must be done with adhesives having limited thermal conductivity.

POWER MANAGEMENT FOR SPATIAL POWER COMBINERS

BACKGROUND OF THE INVENTION

1. Field of the Invention

This invention relates to spatial power combiners, such as quasi-optic grid arrays, and in particular to architectures for efficiently removing heat generated by, and supplying bias to, spatial power combiners.

2. Description of Related Art

Broadband communications, radar and other imaging systems require the generation and transmission of radio frequency ("RF") signals in the microwave and millimeter wave bands. In order to efficiently achieve the levels of output transmission power needed for many applications at these high frequencies, a technique called "power combining" has been employed, whereby the output power of individual components are coupled, or combined, thereby creating a single power output that is greater than an individual component can supply. Conventionally, power combining has used resonant waveguide cavities or transmission-line feed networks. These approaches, however, have a number of shortcomings that become especially apparent at high frequencies. First, conductor losses in the waveguide walls or transmission lines tend to increase with frequency, eventually limiting the combining efficiency. Second, these resonant waveguide cavities or transmission-line combiners become increasingly difficult to machine as the wavelength gets smaller. Third, in waveguide systems, each device often must be inserted and tuned manually. This is labor-intensive and only practical for a relatively small number of devices.

Several years ago, "spatial power-combining" was proposed as a potential solution to these problems. In spatial power-combining, the individual outputs of microwave and millimeter wave solid-state devices combine in free space to provide a single combined power output more effectively than can ostensibly be achieved using the above-described conventional power-combining techniques.

As used herein, the term "spatial power-combining" broadly applies to all structures that couple component outputs in free space. A subset of spatial power-combining that has recently received significant attention is called "quasi-optical power combining." The theory underlying "quasi-optics" is that an array of microwave or millimeter-wave solid state sources placed in a resonator could synchronize to the same frequency and phase, and their outputs would combine in free space, thus minimizing conductor losses. Furthermore, monolithic fabrication enables potentially thousands of microwave or millimeter wave active devices to be incorporated on a single wafer.

Since then, numerous quasi-optical devices have been developed, including detectors, multipliers, mixers, and phase shifters. These passive devices continue to be the subject of ongoing research. Over the past few years, however, active quasi-optical devices, namely oscillators and amplifiers, have evolved. One benefit of spatial power combining (over other methods) using quasi-optics is that the output power scales linearly with chip area. Thus, the field of active quasi-optics has attracted considerable attention in a short time, and the growth of the filed has been explosive.

A quasi-optical array amplifier includes a two-dimensional sheet of active devices, interconnected with patterned conductors, that accepts a polarized electromagnetic wave as an input and radiates an amplified output wave with a polarization that is orthogonal to the input polarization. Two array amplifier configurations that have been previously reported are transmission-mode arrays and reflection-mode arrays. FIG. 1 shows a typical transmission-mode grid amplifier 10, wherein an array of closely-spaced interconnected differential pairs of transistors 14 are formed in a grid-like pattern on the front surface of a semiconductor chip 12. The chip is sandwiched between an input polarizer 18 and an output polarizer 24. An input signal 16 passes through the horizontally polarized input polarizer 18 and creates an input beam incident from the left that excites rf currents on the horizontally-patterned, polarized, metal input antennas 20 of the grid on the chip 12. These currents drive the inputs of the transistor pairs 14 in the differential mode. The output currents are redirected along the grid's vertically-patterned polarized antennas 22, producing, out the right side of the array, a vertically polarized output beam 30 via an output polarizer 24.

Reflection-mode arrays also use two-dimensional active grids similar to the active grids in transmission mode arrays. However, reflection-mode arrays require that the EM radiation have access to only the front (active grid) surface of the chip The back surface of the chip is mounted on a dielectric substrate atop a metallic mirror.

Unfortunately, drawing heat away from quasi-optical arrays and, more generally, from any type of spatial power combiners remains a problem, especially for high-power, high-frequency applications. In microwave and millimeter wave semiconductor devices, heat is generated in the circuitry fabricated on the front (or top) surface of the semiconductor. In conventional microwave and millimeter wave circuits, in order to enhance heat removal, the semiconductor wafer is typically thinned to a final thickness of 50 to 150 microns. Further, the back (or bottom). surface of the semiconductor chip is completely covered with a metal "ground plane," which acts as an equipotential shield and return conductor to the power supply, that is electrically connected to the devices on the front surface through metallic "vias." Additionally, this metal layer provides both a mechanical support as well as a surface for soldering devices to a metalized carrier, thus enabling a high thermal conductivity interface between the device and its package.

In quasi-optical grid arrays, the microwave/millimeter wave signals radiate into or are absorbed from fields above and below the semiconductor. Covering the back surface of the semiconductor with metal would impair the coupling of radiation fields to the patterned conductor on the front surface of the semiconductor, and would completely prevent the transmission of the radiated signals through the semiconductor wafer.

Previous implementations of monolithic grid arrays have been fabricated on semiconductor chips without metal ground planes disposed on their back surfaces. As seen in FIG. 1, in order to draw the substantial amount of heat generated in the circuitry away from the grid array, the back surface of the chip is generally mounted on a dielectric heat spreading slab 13. This dielectric slab is typically attached to the bottom, or back surface of the semiconductor chip 12 using an electrically non-conductive adhesive. Further, DC power supply to the active devices (biasing) has been carried out using the patterned metal lines placed exclusively on the front surface of the semiconductor chip. Unfortunately, having all of the conductors on the front side of the chip limits the efficiency of the biasing, and the absence of backside metal precludes the use of high thermal conductivity attachments using a solder or traditional eutectic die-attach.

Thus, there is a definite need for an improved means for removing heat generated by active devices in spatial power combiners, such as quasi-optical grid arrays, especially where higher output powers are required. There is also a need for improved methods and structures that allow for more flexibility in the placement of bias and tuning elements.

SUMMARY OF THE INVENTION

The present invention, which addresses these needs, resides in novel structures and techniques for monolithic spatial power-combining devices and systems, such as quasi-optical grid arrays, that improve power management in these systems and devices. While various preferred embodiments will be discussed in connection with spatial power-combining, quasi-optical grid structures, it should be understood that the invention is not so limited. Rather, the present invention is also generally applicable to any planar semiconductor chip that cannot or does not benefit from a continuous metal ground plane covering the back surface of the chip. Improved power management refers to increasing efficiency in drawing heat away from the heat-generating active components on the front surface of the spatial power-combiner, as well as providing other advantages, such as flexibility in the placement of DC biasing and tuning elements.

One aspect of the present invention discloses a planar spatial power-combining architecture having patterned metal on the back surface of the power combining semiconductor chip. This pattern either complements or supplants the patterned metal that is typically disposed on the front surface of the chip. The patterned metal on the back surface (a) provides an alternative (and improved) location from which to supply DC biasing to the components on the front of the chip, or (b) enables this heat-conducting material to be joined to other metallic, heat-conducting structures for efficient heat removal from the chip. In some embodiments, the back surface metal pattern can serve both functions at the same time. In other applications where conventional continuous ground planes are not appropriate, the selected metal patterns on the back surface can serve as a ground in place of the ground plane.

The present invention also discloses a system that includes this novel power-combining chip attached to a thermally conductive dielectric substrate that may have an electrically conductive (e.g., metallic) pattern disposed on one or both surfaces. It may also include a highly thermally conductive dielectric superstrate which may or may not have an electrically conductive pattern disposed thereon. Unlike the continuous metal ground plane used on the back surface of conventional semiconductor chips, the patterned metal on the backside of the spatial power-combining semiconductor chip and on the dielectric slabs can be designed so as not to impair the coupling between, for example, the grid array and the incident radiation fields, but to actually improve it.

Thus, more particularly, disclosed is a spatial power-combining chip having a front surface having a plurality of active devices disposed thereon and a patterned, electrically-conductive material disposed on the back surface of the chip. The chip may or may not include conventional patterned, electrically-conductive material disposed on its front surface. The chip may also include vias through the chip and between the front and back surfaces for providing a DC power-supplying path to the devices on the front surface of the chip. It should be understood that the active devices disposed onto the front surface refers broadly to any conventional technique for fabricating or integrating active devices onto, into or with semiconductor wafers or chips. Further, the active devices may be any appropriate three-terminal active devices that can be fabricated with a semiconductor chip, such as, for example, pHEMT or BJT transistors. These active devices are interconnected and comprise any spatial power-combining circuit such as a quasi-optical grid array.

An integrated, spatial power-combining system including a spatial power-combining chip and a thermally-conductive, dielectric substrate is also disclosed. The chip has a front surface with a plurality of active devices disposed thereon, and a back surface with patterned, electrically-conductive material disposed thereon. The substrate has a front surface that is attached to the back surface of the spatial power-combining chip. The front surface of the dielectric substrate may include patterned, electrically-conductive material disposed thereon that is connected to the patterned material on the back surface of the power-combining chip. This metal-to-metal connection can provide the dual benefits of electrical conduction for supplying bias to the chip and excellent thermal conduction for drawing heat away from the chip. It should be understood that this metal-to-metal connection may be accomplished using any appropriate electrically-conducting joint that may or may not use additional material for making the connection. For example, solder bonding, thermo-compression bonding, ultrasonic bonding or applying electrically-conducting adhesive between the metal patterns, may be used.

In a more detailed aspect of the invention, the system may also include a thermally-conductive, dielectric superstrate having a back surface joined to the front surface of the spatial power-combining chip. These surfaces may be joined via a thermally-conductive dielectric joint, a metal-to-metal connection, or a combination of both.

In another aspect of the present invention, an integrated spatial power-combining system having a spatial power-combining chip and a thermally-conductive superstrate is disclosed. The chip has front and back surfaces and active devices integrated on the front surface; and the superstrate has a back surface attached to the front surface of the spatial power-combining chip. One advantage that a superstrate structure may have over a substrate is that it is physically located closer to the front surface of the chip—the source of the heat generation—and thus can provide very efficient heat removal.

A method of drawing heat away from a spatial power-combining chip is also disclosed. The method includes providing a metal pattern on the back surface of the chip, providing a metal pattern on the front surface of a dielectric substrate, and joining the metal pattern on the back surface of the chip to the metal pattern on the front surface of the substrate in order to draw heat generated by the active devices away from the chip. In another aspect, the method includes providing a thermally-conducting dielectric superstrate having front and back surfaces, and attaching the front surface of the power-combining chip to the back surface of the superstrate via a thermally-conducting joint. In yet more detail, the back surface of the thermally-conducting dielectric superstrate includes a metal pattern disposed thereon. Here the metal pattern disposed on the back surface of the superstrate is joined with the front surface of the chip, which may have metal pattern.

A novel method of providing DC power to active components on a power-combining chip is also disclosed. The method includes providing a metal pattern on the back surface of the power-combining chip, selectively connecting one or more of the active components to the metal pattern on the back surface of the chip; and providing DC power to the metal pattern on the back surface of the chip. Vias disposed between the front and back surfaces of the power-combining chip may be used to supply a DC biasing path to the front of the chip.

This method may further include providing a thermally-conducting, dielectric substrate having a front surface with a metal pattern disposed thereon, electrically connecting the metal pattern on the front surface of the dielectric substrate to the metal pattern on the back surface of the power-combining chip, and supplying DC power to the metal pattern on the front surface of the dielectric substrate.

In yet a further aspect, another method of providing DC power to active components on a power-combining chip is disclosed. This method includes, providing a thermally-conducting dielectric superstrate having a back surface with a metal pattern disposed thereon, electrically connecting the metal pattern on the back surface of the superstrate to selected components on the front surface of the structure; and applying DC power to the metal pattern on the back surface of the superstrate.

Other features and advantages of the present invention will become more apparent from the following description of the preferred embodiments, taken in conjunction with the accompanying drawings, which illustrate, by way of example, the principles of the invention.

DETAILED DESCRIPTION OF THE PREFERRED EMBODIMENTS

Figure 1:
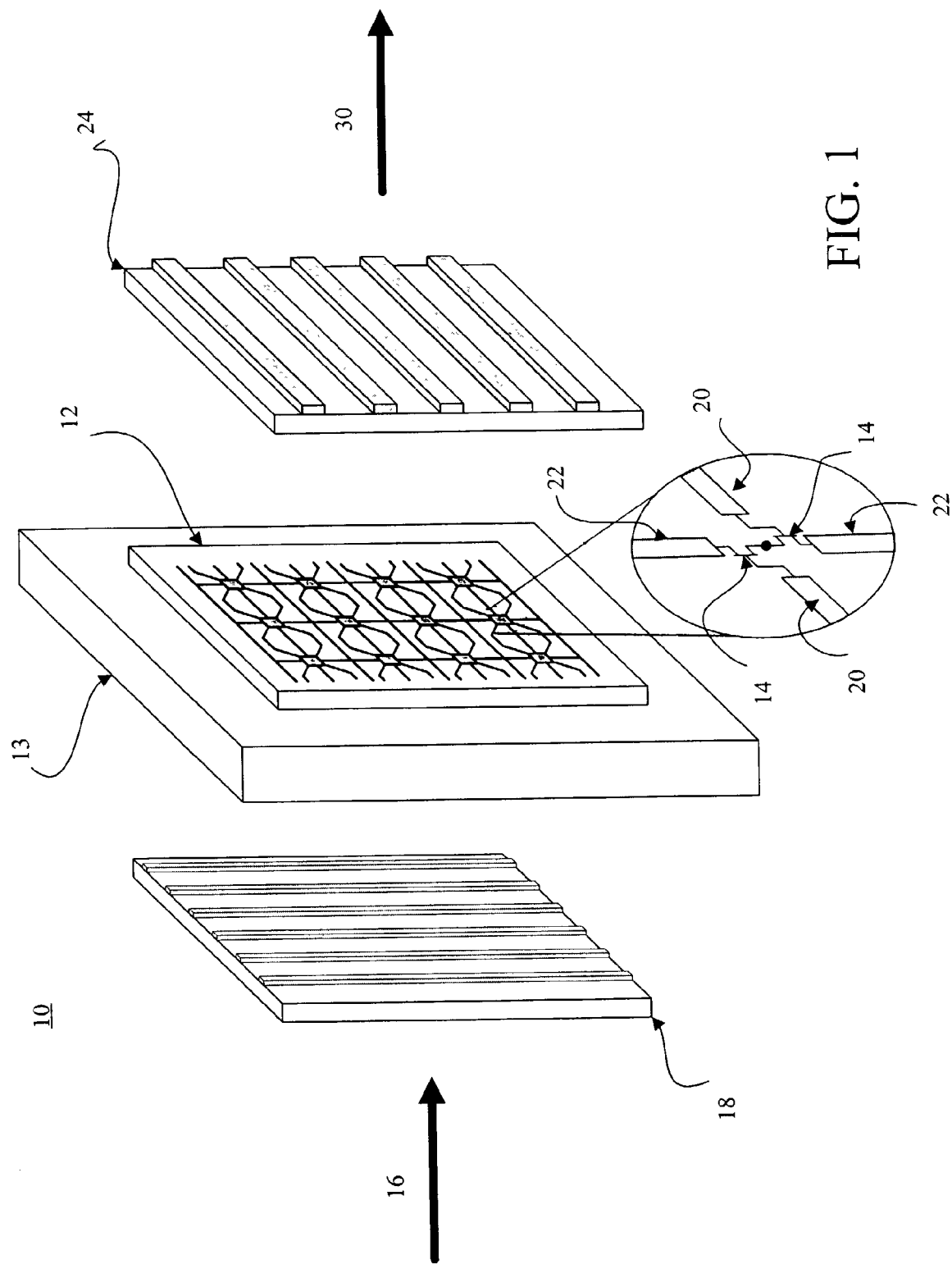
FIG. 1 is an exploded view of a conventional transmission mode quasi-optical grid array with one of the differential pair unit cells in the array magnified.
Figure 2:
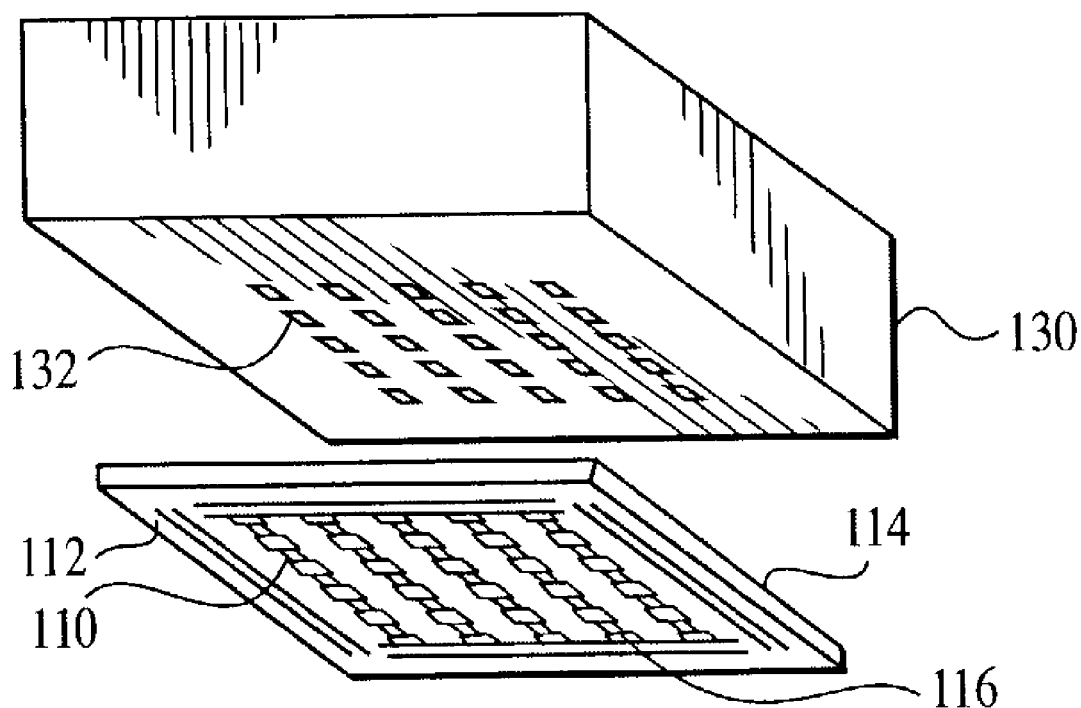
FIG. 2 is an exploded view of a quasi-optical grid array that implement several features of the present invention.
Figure 2:
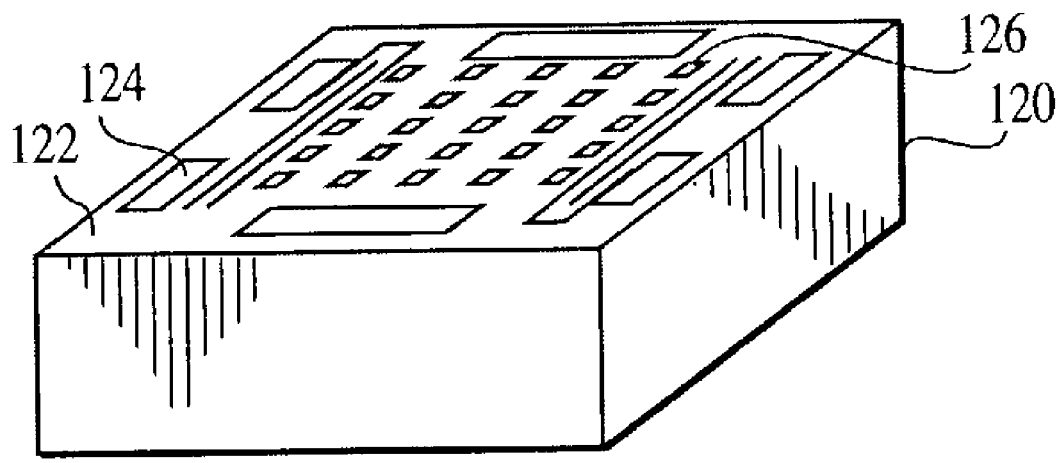

FIG. 2 shows an exploded view of the primary components of one illustrative embodiment of an improved quasi-optical grid array system 100 according to the present invention. The system includes a "substrate" 120, a "spatial power-combining semiconductor chip structure" (and more specifically, in this embodiment, a quasi-optical grid array) 110 and a "superstrate" 130. The semiconductor chip structure 110 has a grid array with active devices and patterned electrical conductors on the front surface 114 (not shown, but is similar to the patterns on the front surface of the grid array shown in FIG. 1) and patterned electrical conductors 116 on its back surface 112. The chip may also include 'vias' connecting the conductors on its two faces, or surfaces, 114 and 116. The vias and the back surface conductors tend to improve heat removal from the array, and to improve flexibility in providing biasing and rf matching for the grid array. Alternatively, the patterned conductors on the back surface of the chip may actually replace the patterned conductors that are conventionally found on the front surface of grid arrays. In this variation, the back surface patterned metal would preferably by connected directly to the active components on the front side of the array through vias. One advantage of placing the patterned conductors on the back surface is that the patterned metal does not compete for real estate on the back surface with components as it must on the front surface of the chip. Thus, it is possible to provide thicker metalization patterns on the back surface than is possible on the front side, thereby providing inherently lower voltage drops (lower resistance/higher efficiencies), simplified layout and enhanced manufacturability.

The substrate 120 is a slab made of any appropriate thermally-conductive material, such as ceramic, and, in this embodiment, has patterned, electrically-conductive material (e.g. a metal pattern) 124, 126 disposed on its front surface 122. This material may also optically be disposed on the back surface of the substrate (not shown). When mated with the patterned metal on back surface of the chip, this patterned material can improve delivery of DC power to the active components in the array on the chip 110 (biasing), can enhance the removal of waste heat from the array, and can improve radio frequency (rf) matching.

The superstrate 130 is a thermally conductive dielectric material such as a ceramic slab or thermally conductive encapsulant. The superstrate may also have patterned electrically-conducting material 132 on its back surface in order to enhance heat removal from, and biasing and tuning for the grid array. Each section is attached to the adjacent section through a process and/or means that provides mechanical support, heat removal, and (in some embodiments) electrical connection. Adjacent sections may be attached, or joined, with thermally-conductive adhesives or epoxies and for regions in which there is metal-to-metal contact, any appropriate bonding technique and material, collectively called joint, may be used, such as soldering, thermo-compression, ultrasonic bonding, electrically-conductive adhesives or any appropriate combination of these techniques and/or materials.

Figure 3:
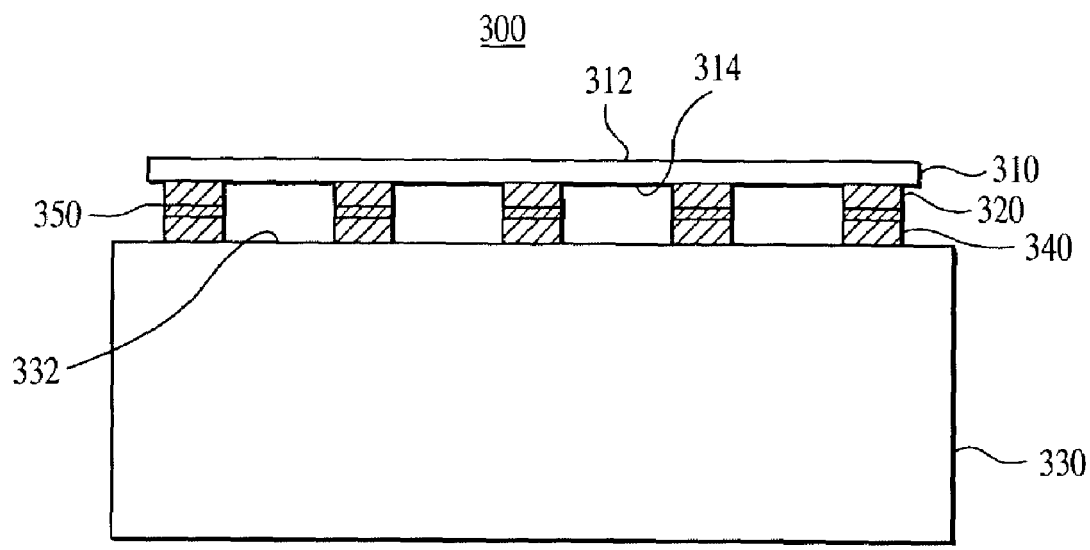
FIG. 3 is a cross-sectional side view of one preferred embodiment of the present invention.

Various permutations of these features that incorporate the principles of the invention and result in novel spatial combining devices, such as quasi-optical grid array amplifiers or oscillators, with enhanced thermal properties and potentiall improved biasing options are now described. One embodiment includes a spatial-power combining chip 110 (with or without patterned metal on its back surface) attached to the superstrate 130 and without a substrate 120. FIG. 3 shows in cross-sectional view, another alternative embodiment of an improved spatial power-combining system 300 according to the present invention. In particular, the system includes two primary structures, namely, a quasi-optical grid array chip 310 and a thermally-conductive, dielectric substrate 330. The chip has a front surface 312 and a back surface 314 with patterned, electrically-conductive material 320 disposed on the back surface. The substrate also has patterned, electrically-conductive material 340 disposed on it front surface 332. The chip is attached to the substrate by joining the two sets of patterned materials together via solder joint 350. DC bias is supplied to the devices on the chip's front surface 312 (not shown) either from the patterns 320 on the back surface by means of vias through the chip or by the conventional means of connecting the DC source(s) to the patterns on the front surface 312.

Figure 4:
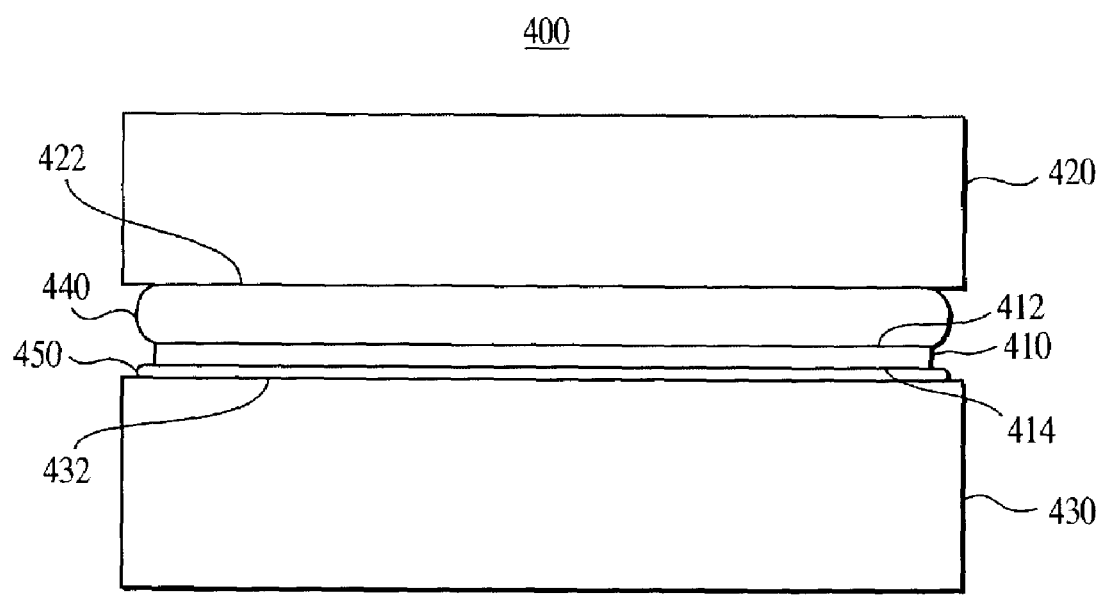
FIG. 4 is a cross-sectional side view of a first alternative embodiment of the improved heat-dissipating, quasi-optical grid array system of the present invention.

FIG. 4 shows in cross-sectional view, a second alternative embodiment of an improved spatial power-combining system 400 according to the present invention. In particular, the system includes three primary structures, namely, a quasi-optical grid array chip 410 and a substrate 430 and a superstrate 420. The back surface 414 of the chip is attached to the front surface 432 of the substrate via a dielectric thermally conductive adhesive 450. The front surface 412 of the chip is attached to the back surface 422 of the superstrate via another dielectric thermally-conductive adhesive 440.

Figure 5:
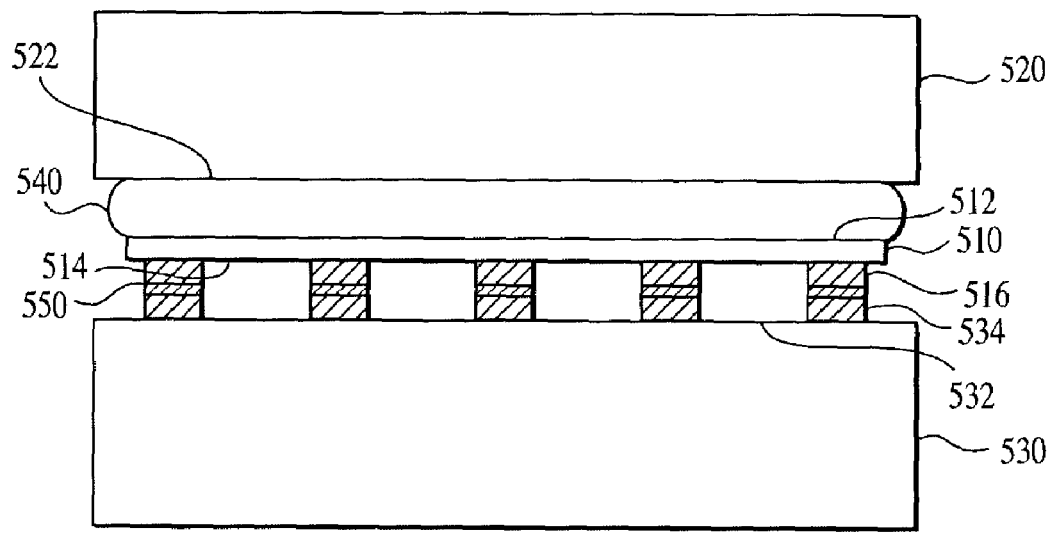
FIG. 5 is a cross-sectional side view of a second alternative embodiment of the improved heat-dissipating, quasi-optical grid array system of the present invention.

FIG. 5 shows in cross-sectional view, a third alternative embodiment of an improved spatial power-combining system 500 according to the present invention. In particular, the system includes three primary structures, namely, a quasi-optical grid array chip 510 and a substrate 530 and a superstrate 520. The chip has a front surface 512 and a back surface 514 with patterned, electrically-conductive material 516 disposed on the back surface. The substrate also has patterned, electrically-conductive material 534 disposed on its front surface 532. The chip is attached to the substrate by matching and joining the patterned materials 516 on the chip to the patterned material 534 on the substrate via solder joint 550. The back surface 522 of the superstrate 520 is attached to the front surface 512 of the chip via a dielectric thermally-conductive adhesive 540.

DC bias is supplied to the devices on the chip's front surface 512 (not shown) either from the patterns 516 on its back surface by means of vias through the chip or by the conventional means of connecting the DC source(s) to the patterns on the front surface 512.

Figure 6:
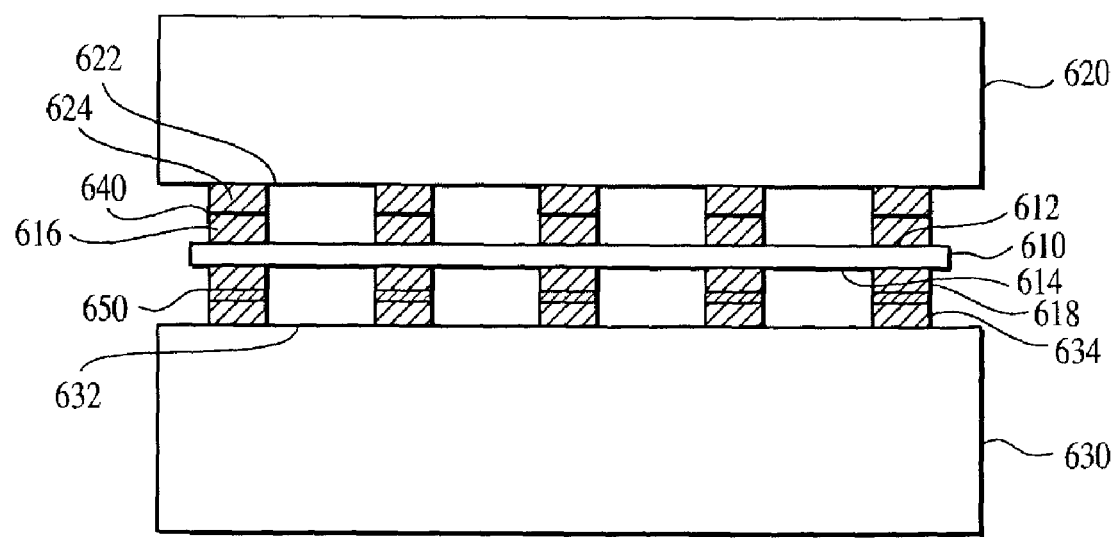
FIG. 6 is a cross-sectional side view of a third alternative embodiment of the improved heat-dissipating, quasi-optical grid array system of the present invention.

FIG. 6 shows in cross-sectional view, a fourth alternative embodiment of an improved spatial power-combining system 600 according to the present invention. In particular, the system includes three primary structures, namely, a quasi-optical grid array chip 610 and a substrate 630 and a superstration 620. The chip has a front surface 612 and a back surface 614, each with patterned, electrically-conductive material 616 and 618 disposed thereon, respectively. The substrate also has patterned, electrically-conductive material 634 disposed on its front surface 632 that partly or substantially matches the metal pattern on the back surface 614 of the chip. The chip is attached to the substrate by joining the two sets of patterned materials 616, 634 together via solder joint 650. The back surface 622 of the superstrate 620 includes patterned, electrically-conductive material 624 disposed thereon. The chip is attached to the superstrate by matching and joining the patterned material 616 on the chip to the patterned material 624 on the superstrate via thermo-compression bonding at 640. DC bias may be supplied via the conventional means to the front of the chip itself, via the metal patterns on the substrate, or via the metal pattern on the superstrate, or via a combination of the above.

Having thus described exemplary embodiments of the invention, it will be apparent that further alterations, modifications, and improvements will also occur to those skilled in the art. Further, it will be apparent that the present technique and system is not limited for use with quasi-optical array structures (e.g. grid amplifiers, oscillators, mixers, etc.), but is applicable to any spatial power combiner that can benefit from being integrated with heat-removing and bias-supplying structures. Moreover, the present invention is not limited to spatial power combiners. Rather, it is applicable to any type of integrated semiconductor chip that cannot properly function with a conventional conducting solid ground plane that covers substantially the entire back surface of the chip, but can benefit from the selective conducting pattern structures and methods of the present invention. Accordingly, the invention is defined only by the following claims.

We claim:

1. An integrated, spatial power-combining system, comprising:
   (a) a spatial power-combining chip having
      (i) a front surface with a plurality of active devices disposed thereon, and
      (ii) a back surface with patterned, electrically-conductive material disposed thereon; and
   (b) a thermally-conductive, dielectric substrate having a front surface attached to the back surface of the spatial power-combining chip.

2. The system of claim 1, wherein the chip further includes vias disposed between the front surface and patterned, electrically-conductive material on the back surface.

3. The system of claim 1, wherein the front surface of the dielectric substrate includes patterned, electrically-conductive material disposed thereon that is connected to the patterned material on the back surface of the power-combining chip.

4. The system of claim 3, wherein the patterned, electrically-conductive material on the back surface of the power-combining chip is connected to the patterned, electrically-conductive material on the front surface of the substrate with one of a solder bond, a thermo-compression bond, an ultrasonic bond and an electrically-conductive adhesive.

5. The system of claim 1, further including
   (c) a thermally-conductive, dielectric superstrate having a back surface joined to the front surface of the spatial power-combining chip.

6. The system of claim 5, wherein the back surface of the dielectric superstrate is joined to the front surface of the power-combining structure via a thermally-conductive dielectric joint disposed therebetween.

7. The system of claim 5, wherein the back surface of the dielectric superstrate includes patterned, electrically-conductive material disposed thereon that is joined to the front surface of the power-combining structure.

8. The system of claim 7, wherein the front surface of the chip further includes patterned, electrically-conductive material.

9. The system of claim 8, further including
   vias disposed within the spatial power-combining structure and between the patterns on the front and back surfaces of the structure that provides an electrical path for DC power to the front surface of the chip, and wherein
   the patterned, electrically-conductive material disposed on the front surface of the substrate is joined to the patterned, electrically-conductive material disposed on the back surface of the power-combining structure via an electrically-conducting joint, and
   the patterned, electrically-conductive material disposed on the back surface of the superstrate is joined to the patterned, electrically-conductive material disposed on the front surface of the power-combining structure via an electrically-conducting joint.

10. The system of claim 1, wherein the plurality of active devices comprise a quasi-optical grid array.

11. An integrated spatial power-combining system, comprising:
    (a) a spatial power-combining chip having front and back surfaces and active devices integrated on the front surface; and
    (b) a thermally-conductive, dielectric superstrate having a back surface attached to the front surface of the spatial power-combining chip, wherein the back surface of the dielectric superstrate includes patterned, electrically-conductive material disposed thereon that is connected to the front surface of the power-combining chip.

12. The system of claim 11, wherein the front surface of the chip further includes patterned, electrically-conductive material that is connected to the patterned, electrically-conductive material on the back surface of the superstrate with one of a solder bond, a thermo-compression bond, an ultrasonic bond and an electrically-conductive adhesive.

13. The system of claim 12, further including
(c) a first thermally-conductive joint disposed between the front surface of the power-combining chip and the back surface of the superstrate.

14. The system of claim 13, further including
(d) a thermally-conductive, dielectric substrate having a front surface attached to the back surface of the chip.

15. The system of claim 14, further including
a thermally-conductive joint disposed between the back surface of the power-combining chip the front surface of the substrate.

16. A method of drawing heat away from a spatial power-combining chip having a front surface with heat-generating, active components disposed thereon and a back surface that is connected to a thermally-conducting substrate, comprising:
(a) providing a metal pattern on the back surface of the chip;
(b) providing a metal pattern on the front surface of the substrate; and
(c) joining the metal pattern on the back surface of the chip to the metal pattern on the front surface of the substrate in order to draw heat generated by the active devices away from the chip.

17. A method of drawing heat away from a spatial power-combining chip having a front surface with a plurality of heat-generating active devices disposed thereon, comprising:
(a) providing a thermally-conducting dielectric superstrate having front and back surfaces; and
(b) attaching the front surface of the power-combining chip to the back surface of the superstrate via a thermally-conducting joint.

18. The method of claim 17, wherein the back surface of the thermally-conducting dielectric superstrate includes a metal pattern disposed thereon, and wherein the attaching includes joining the metal pattern disposed on the back surface of the superstrate with the front surface of the chip.

19. The method of claim 18, wherein the front surface of the chip further includes a metal pattern disposed thereon and the metal pattern on the back surface of the superstrate is joined to the metal pattern on the front surface of the chip.

20. A method of providing DC power to active components on a power-combining chip having front and back surfaces, wherein the components are disposed on the front surface of the chip, comprising:
(a) providing a metal pattern on the back surface of the power-combining chip;
(b) selectively connecting one or more of the active components to the metal pattern on the back surface of the chip;
(c) providing DC power to the metal pattern on the back surface of the chip;
(d) providing a thermally-conducting, dielectric substrate having a front surface with a metal pattern disposed thereon;
(e) electrically connecting the metal pattern on the front surface of the dielectric substrate to the metal pattern on the back surface of the power-combining chip; and
(f) supplying DC power to the metal pattern on the front surface of the dielectric substrate.

21. The method of claim 20, wherein one or more of the active components are selectively connected to the metal pattern on the back surface of the chip with vias disposed between the front and back surfaces of the power-combining chip.

22. A method of providing DC power to active components on a power-combining chip having front and back surfaces, wherein the components are disposed on the front surface of the chip, comprising:
(a) providing a thermally-conducting dielectric superstrate having a back surface with a metal pattern disposed thereon;
(b) electrically connecting the metal pattern on the back surface of the superstrate to selected components on the front surface of the chip; and
(c) applying DC power to the metal pattern on the back surface of the superstrate.

* * * * *